United States Patent [19]

Antoshenkov

[11] Patent Number: 5,363,098
[45] Date of Patent: Nov. 8, 1994

[54] BYTE ALIGNED DATA COMPRESSION

[75] Inventor: Gennady Antoshenkov, Amherst, N.H.

[73] Assignee: Digital Equipment Corporation, Maynard, Mass.

[21] Appl. No.: 142,640

[22] Filed: Oct. 25, 1993

[51] Int. Cl.$^5$ ............... H03M 7/00; H03M 7/46
[52] U.S. Cl. ........................... 341/95; 341/63; 341/50
[58] Field of Search ............ 341/63, 59, 95, 50; 358/261.1

[56] References Cited

U.S. PATENT DOCUMENTS

| | | | |
|---|---|---|---|
| 3,656,178 | 4/1972 | De Maine et al. | 444/1 |
| 4,495,639 | 1/1985 | Mosier et al. | 341/63 |
| 4,606,002 | 8/1986 | Waisman et al. | 364/200 |
| 4,610,027 | 9/1986 | Anderson et al. | 341/63 |
| 4,626,829 | 12/1986 | Hauck | 341/63 |
| 4,630,030 | 12/1986 | Roy | 340/347 |
| 4,684,923 | 8/1987 | Koga | 341/63 |
| 4,782,325 | 11/1988 | Jeppsson et al. | 341/55 |
| 4,841,299 | 6/1989 | Weaver | 341/63 X |
| 4,868,570 | 9/1989 | Davis | 341/106 |
| 4,988,998 | 1/1991 | O'Brien | 341/55 |
| 5,006,849 | 4/1991 | Baarman et al. | 341/95 |
| 5,049,881 | 9/1991 | Gibson et al. | 341/95 |

*Primary Examiner*—Sharon D. Logan
*Attorney, Agent, or Firm*—Albert P. Cefalo; Dirk Brinkman

[57] ABSTRACT

In a system for compressing, decompressing, and logically manipulating arbitrary bit-maps, the bit-map is aligned along byte boundaries. Each aligned byte is classified as a gap byte if all of the bits of the byte store the same logical value, otherwise the byte is classified as a non-gap byte. Adjacent bytes of the same class are grouped. Groups of gap bytes are encoded into an atomic sequence of bytes as a count of the number of bits included in the grouped gap bytes. Map bytes are duplicated in the atomic sequence and also associated with a count thereof.

9 Claims, 6 Drawing Sheets

BYTE ALIGNED DATA COMPRESSION

FIELD OF THE INVENTION

The present invention relates generally to computer systems, and more particularly to compressing data stored in a memory of a computer system.

BACKGROUND OF THE INVENTION

In computer systems, it is well known that the amount of physical space required to store data can be reduced by compressing the data to a more compact format. Furthermore, as an additional advantage, compressed data can generally be processed in less time than uncompressed data. For example, fewer bits are processed when compressed data are communicated from one computer system to another. Data compression is frequently used for large data bases, graphic images, and full-text inverted files.

One type of compression that is sometimes used for integer vectors is "bit-map" encoding. With bit-map encoding, each integer of the vector is represented in a bit-map by a single bit. A logical "1" in a bit position of the bit-map signifies the presence of an integer, and a logical "0" denotes the absence of an integer. Not only is there a substantial reduction in space, but also, time is saved during processing, since the representative bits of the bit-map can be directly accessed and manipulated.

Bit-maps are comparatively efficient in space and time utilization for compressing dense vectors. Dense vectors are vectors which are populated with a relatively large number of integers. However, bit-maps suffer space and time losses for sparse vectors, or vectors with skewed densities. In bit-maps representing sparse vectors, a large proportion of the bit map space is wasted on bit sequences having nothing but logical zeroes.

For vectors which lack any type of systemic bit distribution, "bit-wise" compression is sometimes used. Bit-wise compression derives space reduction from the fact that the differences between consecutive integers in a vector are typically small for very large vectors. Thus, the number of significant bits in the differences between consecutive integers can be encoded more compactly than the integers themselves. Each difference is encoded as a "prefix" bit string, followed by a "suffix" bit string. The prefix bit string encodes the number of bits in the suffix, and the suffix bit string encodes all significant bits of the difference. Bit-wise compression which encodes successive differences is sometimes known as Delta-compression.

Bit-wise compression compresses close to the theoretical limit for any kind of distribution of the compressed data. However, data which are compressed bit-wise suffer because the compressed representation of the data can generally not be manipulated directly by logical operators, such as AND, OR, and XOR (exclusive OR), and the like. Therefore, bit-wise compression generally requires time consuming encoding and decoding in order to perform logical operations, making bit-wise compression less suitable for data which are logically manipulated.

Furthermore, bit-wise compression utilizes bit strings of various sizes not always compatible with logic circuits and data paths used to manipulate them. For example, digital computers are generally designed to operate on bits organized in fixed-sized bytes. Thus, bit-wise compression must either waste space to keep the prefix and suffix strings aligned along easily manipulated byte boundaries, or time is wasted to parse the variable bit lengths of the prefix and suffix into manipulatable bytes.

Taking the foregoing into consideration, it is apparent that there is a need for a compression technique which compresses data regardless of the data content. Furthermore, it is desirable that logical operations on the compressed data be possible without requiring the data to be fully decompressed.

SUMMARY OF THE INVENTION

The invention provides for compressing source data expressed in arbitrary bit-maps to achieve higher encoding and decoding efficiency with reduced data storage requirements and improved processing performance. The invention is particularly applicable to computer systems processing large databases, and where multiple accesses and logical operations on the databases are frequent occurrences.

Broadly, the invention provides data structures which take advantage of the hardware characteristics of the computer system and spatial relationships which exist in the source data. Furthermore, the invention uses encoding and decoding techniques which are optimized for the computer system characteristics and the source data relationships.

In one aspect of the invention, the quantum for encoding, decoding, and manipulating compressed data are uniformly sized bytes. That is, the bits of the bit-map are organized into byte sized portions aligned at boundaries convenient for, and compatible with the hardware characteristics of the computer system. For example, each byte sized portion of the bit-map includes eight bits.

For the purpose of encoding the source or input bit-map into an output compressed atomic sequence of bytes, the following general principles are observed. Each of the organized bytes is classified as a "gap byte" (GBYTE) if all of the bits of a byte store the same logical value, otherwise the byte is classified as a non-gap or "map byte" (MBYTE). Gap bytes can further be classified as either storing all zeros, or all ones. A map byte can further be classified as an "off-set" byte if all of the bits but one store the same value as a preceding adjacent gap byte. That is, an off-set byte has exactly one bit different than the bits of the immediately preceding gap byte.

Adjacent classified bytes of the same class are grouped and the number of bits in each group are counted. Then, in a destination or output atomic sequence of bytes, the bytes of the classified and grouped input bit-map are encoded as follows. For each group of gap bytes, store a first bit sequence representing the number of bits in each of the group in the atomic sequence. Also store a flag to indicate whether the group stores zeros or ones.

For each of the groups of map bytes, in the output atomic sequence, store a second bit sequence representing the number of bits in the group, and store the group of map bytes. If the classified byte is an off-set byte, store a third bit sequence in the atomic sequence, the third bit sequence indicating the position of the one different bit within the off-set byte.

The first, second, and third bit sequences are organized into atoms structured as follows. Each atom of encoding includes a control byte (CBYTE), possibly followed by one or more "GBYTEs", and possibly one or more "MBYTEs". The control byte includes a "TFIELD", a "FFIELD", and a "DFIELD". The first bit sequence is stored in the TFIELD of the control byte if the number of gap bytes in the group is less than a first threshold, for example, four. Otherwise, the first bit sequence is stored in the gap bytes. The flag is stored in the FFIELD, and the second or third bit sequences are stored in the DFIELD depending if the gap bytes are immediately followed by map bytes or an off-set byte. The length associated with map bytes are stored in the DFIELD of the control byte, and the map bytes follow the control byte.

In another aspect of the invention, the bit-map is encoded into an atomic structures by scanning the bit-map, bit by bit and classifies bytes according to the general principles outlined above. The control byte, gap bytes, and map bytes are generated on the fly, as the bits are individually examined. This method guarantees a unique sequence of atomic structures for each different bit-map to facilitate the determination of bit-map identities. In addition, this method is guaranteed to generate the most compact atomic sequence.

In yet another aspect of the invention, the atomic sequence is decoded to recover the bit-map. The decompressing method scans the atomic sequence using the control byte to decode the variously encoded bit sequences to generate the bit-map.

And, in yet another aspect of the invention, multiple compressed bit-maps are merged by using logical operators such as AND and OR. The merging method partially decodes the atomic sequence representing the bit-maps to be merged, and performs the required logical operation on decomposed bytes to generate a new atomic sequence representing the merged bit-maps. This method enables the logical manipulation of compressed bit-maps in less time than is possible with Delta-compression. The structures and methods of the invention are particularly suited for bit-maps representing images, data bases or full text inverted files having arbitrary bit distributions.

DETAILED DESCRIPTION OF THE PREFERRED EMBODIMENT

Figure 1:
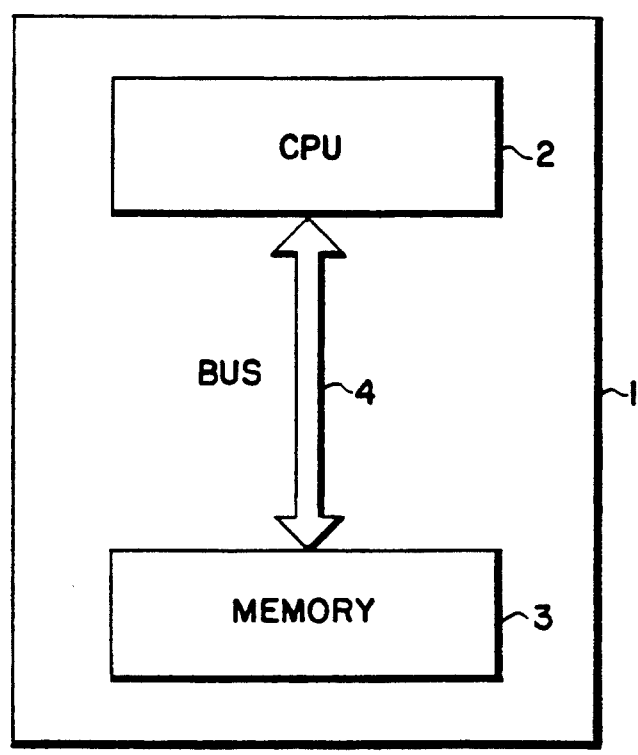
FIG. 1 is a block diagram of a computer system which can use the invention.

FIG. 1 shows a computer system 1 which can use the invention. The computer system 1 can include a central processing unit (CPU) 2 and a storage device, for example memory 3, communicating with each other via a bus 4. The CPU 2 is any type of conventional processor of data, for example, a main frame, work station, microprocessor, personal computer, or the like. The memory 3 is any type of memory capable of storing data, for example, semiconductor volatile random access memory, registers, or permanent disk storage. Space to store the data, and time to process the data can both be reduced by encoding the data into a more compact format as disclosed herein.

Now with reference to FIG. 2, the compression of the present invention will be described using as an example a ascending order vector possibly having integers in the range 0 to 455. A particular expression of the vector includes the integers 8, 11, 19, 174, 181, 189, 191, 450, 451, 453, and 455. If the eleven numbers of the integer vector are stored in the memory 3 in a binary format as thirty-two bit integers, the vector would consume 352 (11×32) bits.

Figure 2:
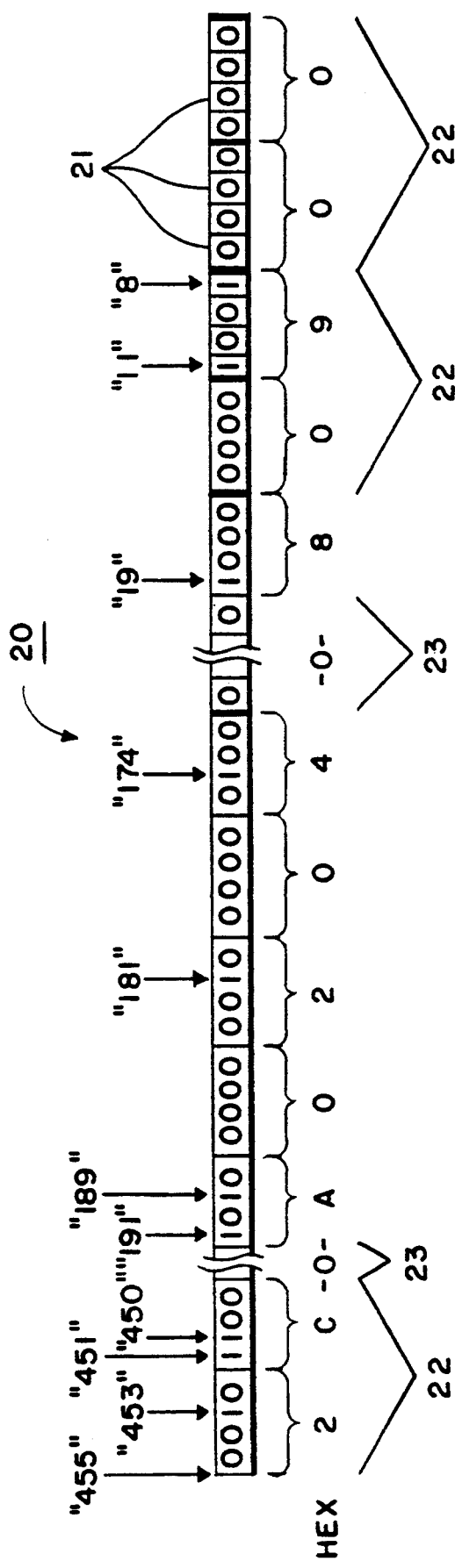
FIG. 2 is a block diagram of a bit-map which can be compressed using the principles of the invention.

Alternatively, as shown in FIG. 2, the integer vector can be stored as a bit-map 20 having a plurality of bits 21 for representing the individual integers of the vector. A logical "0" in a bit position indicates the absence of an integer, and a logical "1" indicates the presence of an integer. As an advantage, the size of the bit-map 20 does not increase as additional integers in the range of 0 to 455 are added to the vector. It should be apparent that the bit-map 20 can represent data sequences other than integer vectors, for example, the bit-map 20 can represent the "on" and "off" states of pixels of an image, or indices to a data base.

The bits 21 of the bit-map 20 are shown from right to left. The right most bit represents the integer "0", the next left bit represents the integer "1", and so forth. The left most bit represents the integer "455" The hexadecimal (hex) equivalent of the bit-map 20 can be written as:

2C-0-A0204-0-80900.

The notation "-0-" is used to indicate a "gap" in the bit-map 20. A gap is defined as a sequence of bits 21 all storing the same logical value, for example, all zeros. Alternatively, a gap of all ones could be expressed as "1-".

What is described herein, is a method and structure for compressing a bit-map, as the one shown in FIG. 2, into less physical space in the memory 3. Furthermore, the reduced size data structure can be logically manipulated by the CPU 2 in less time than would be possible for the uncompressed data.

The invention, gains space and time efficiencies, in part, by optimally encoding the bit-map 20, taking into consideration the underlying hardware structure of the computer system 1, such as, the logic circuits of the CPU 2, the storage cells of the memory 3, and the width of the data path of the bus 4. Therefore, the quantum for encoding, decoding, and manipulating the bit-map 20 are uniformly sized bytes 22. The bytes 22 are aligned at boundaries convenient for, and compatible with the hardware characteristics of the computer system 1. For example, each byte 22 includes eight bits 21. It should be understood that the invention can just as easily be adapted to computer systems having other byte sizes.

The bit-map 20 is compressed by encoding the bits 21 of the bit-map 20 into a byte aligned atomic sequence according to the following general principles.

Each byte of the bit-map is classified as either a gap byte or a non-gap byte. Gap bytes have all the bits the same, and non-gap bytes do not have all the bit the same. Non-gap bytes are, hereinafter, also referred to as "map bytes."

Adjacent bytes of the identical class are grouped and the number of bits included in each classified group is determined.

For grouped gap bytes, the sense of the bits, be they zeros or ones, is determined. Gap bytes having different sensed bits are grouped separately. For grouped map bytes, a determination is made whether the first byte of the group has only one bit different from the sense of a preceding gap. Such a byte is classified as an "off-set byte."

For groups of gap bytes, the length of the group and the sense (zeros or ones) of the group are stored in the atomic sequence. For groups of maps, the length of the group and the group itself are stored in the atomic sequence. Off-set bytes are encoded into the control byte encoding the length of the preceding gap bytes. For consistency, presume that the bit-map 20 is preceded by, for example a zero length, zero filled gap.

Figure 3:
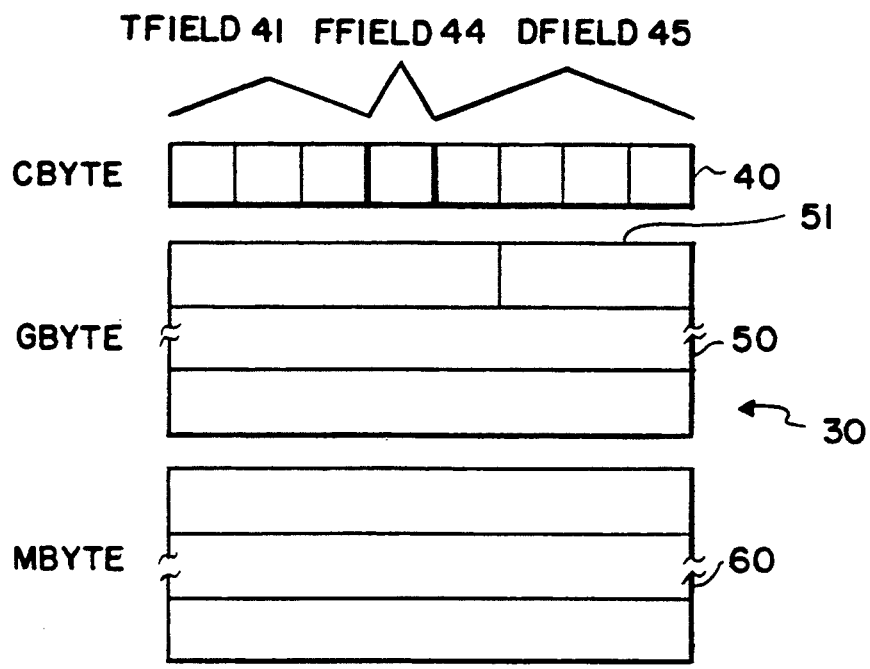
FIG. 3 is a block diagram of a byte aligned compressed atom according to the invention.

FIG. 3 shows the general structure of a byte aligned atom 30 constructed according to these principles. A number of different arrangements of the atom 30 are possible. The different arrangements of the atoms 30 are optimally engineered to compactly compress an unpredictable variety of distributions of logical zeros and ones stored in the bits 21 of the bit map 20.

Each encoded atom 30 includes at least a control byte (CBYTE) 40. As will be described in greater detail hereinafter, each control byte 40 may be followed by one or more encoded gap bytes (GBYTEs) 50, and/or one or more encoded bit-map bytes (MBYTEs) 60.

The specific type of arrangement of a particular atom 30 is encoded in the control byte 40. Therefore, each control byte 40 includes a type field (TFIELD) 41 and a data field (DFIELD) 45. In the exemplary embodiment, the type field 41 includes three bits, and the DFIELD 45 includes four bits. It should become apparent that the invention can also be worked if the control byte 40 is organized into fields having a different number of bits.

The control byte 40 can also include an optional fill field (FFIELD) 44 for indicating whether encoded bits of the gaps are sensed as either all zeros, or all ones. When the FFIELD 44 is a logical "0" the encoded gap is bytes are all zeros, and when the FFIELD 44 is a logical "1", the encoded gap bytes are filled with all ones. If the invention is used only to encode gaps of one kind, either zeros or ones, the FFIELD 44 is not required, and the DFIELD 45 can be expanded to include five bits, for example.

The type field 41 can have values in the range of 0 to 7 to indicating the various structures of the atom 30. The DFIELD 45 can have values in the range of 0 to 15. The optional FFIELD 44 can have values of either 0 or 1.

The gap bytes 50, when present in the atom 30, are a sequence of one to eight bytes used to store the number of consecutively encoded gap bytes. The gap bytes, as previously defined, being a group of bytes having bits all storing the same logical value. The FFIELD 44 of the corresponding control byte 40 of the atom 30 is used to indicate whether the encoded gap bytes 50 have bits which store zeros or ones.

The number of bytes in the gap byte sequence is stored in a GFIELD 51 of the gap bytes 50, for example, the low order three bits of the first gap byte 50. The rest of the bits of the first GBYTE 50 are extended with a binary "0", and any subsequent gap bytes 50 represent the gap size measured in bits, and is always expressed as a multiple of eight. In other words, the gap bytes 50 encode only byte aligned bit gaps. Only bytes with the significant bits of the gap size are represented by the gap bytes 50, all zero leading bytes of the gap size are discarded.

The map bytes 60, when present in the atom 30, are a sequence of one to fifteen bytes of the bit-map 20 not having all the bits the same. The number of bytes in the map byte sequence is stored in the DFIELD 45 of the control byte 40. In other words, map bytes are byte aligned bits of the bit-map 20.

The various structures of the atom 30 used to compress the bit-map 20 will now be described in greater detail. The description of the atoms 30 will be followed by the description of the methods used to encode, decode, and logically manipulate the structures. In this description, the eight bits of the control byte 40 are written as, for example, [TFIELD|FFIELD|DFIELD]. The vertical bars "|" are used as field separators, slashes "/" indicating or, and dashes "-" indicating inclusive ranges.

Table 1 is a summary of the various forms that the atoms 30 can assume.

TABLE 1

| | | General Forms of Atoms | | | |
|---|---|---|---|---|---|
| Case | TFIELD | FFIELD | DFIELD | GBYTEs | MBYTEs |
| 1 | 0–3 | 0 or 1 | 1–15 | No | Yes |
| 2 | 4 | 0 OR 1 | 1–15 | Yes | Yes |
| 3 | 5 | 0–3 | 0–7 | No | No |
| 4 | 6 | 0 or 1 | 0–7 | Yes | No |
| 5 | 7 | 0–3 | 0–7 | No | No |

The first case of the atom 30 has the general form of:

CBYTE=[0–3|0/1|1–15]

When the type field 41 stores a value in the range of 0 to 3, the type field 41 directly indicates the size of the gap encoded. In other words, for atoms 30 having the type field 41 in the range of 0 to 3, the control byte 40 is not followed by any gap bytes 50. Instead, the size of the gap is directly encoded in the type field 41 of the control byte 40. This case is useful for compactly compressing frequently occurring small sized gaps. Whether the gap contains all zeros or ones is indicated by the FFIELD 44. The number of bytes of the bit-map 20 which follow the gap are stored, as explained above, in the DFIELD 45.

The second case of the atom 30 has the general form of:

CBYTE=[4|0/1|1–15]

In this case, the control byte 40 is immediately followed by one or more gap bytes 50, with the gap bytes 50 encoded as described above. The gap bytes 50 are followed by a plurality of map bytes 60, the number of map bytes 60 indicated in the DFIELD 45 of the control byte 40.

Figure 4:
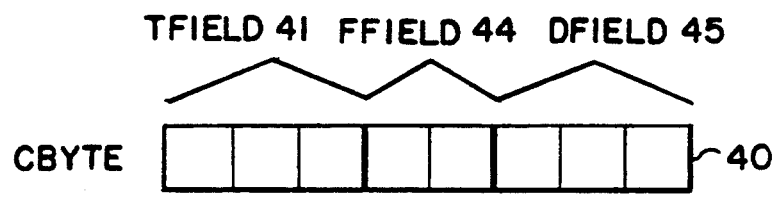
FIG. 4 is a block diagram of another form of a byte aligned compressed atom.

As shown in FIG. 4, for the next three cases, that are the cases were the type field 41 falls into the range of 5 to 7, the control byte 40 is partitioned into a three bit type field 41, a two bit FFIELD 44, and a three bit DFIELD 45. In these cases, the DFIELD 45 is used to encode a byte of the bit-map 20 having all bits but one the same. For example, the encoded byte 22 of the bit-map 20 is either all zeros, with a single one, or the byte 22 has a single zero bit with the rest of the bits set to ones.

The position of the one bit that is different from the rest of the bits in the byte 22 is indicated as on off-set in the DFIELD 45. The off-set being a number in the range of 0 to 7, each number representing one of the eight possible position for the different bit in the byte 22. Hereinafter, this class of bytes will be referred to as an "off-set" bytes.

Off-set bytes are useful for compactly compressing frequently observed bit distributions of the type where a gap is immediately followed by a byte having only a single bit different from the sense of the bits of the gap.

The third case of the atom 30 has the general form of:

CBYTE=[5|0-3|0-7]

In this case, the control byte 40 encodes a gap and a following off-set byte. The size of the gap is indicated in the FFIELD 44. If the TFIELD has a value of 5, the bits of the gap and the off-set byte are all zeros, except for the single "1" bit, whose off-set position is indicated in the DFIELD 45.

The fourth case of the atom 30 has the general form of:

CBYTE=[6|0/1|0-7]

In this case, the control byte 40 is immediately followed by one or more gap bytes 50, with the gap bytes 50 encoded as described above. In the corresponding bit-map, the thus encoded gap is immediately followed by an off-set byte. If the FFIELD 44 is zero, the gap and off-set byte are "0", except for the off-set bit. Alternatively, if the FFIELD 44 is one, the gap and the off-set byte are "1" filled, and the off-set bit is a zero.

The fifth case of the atom 30 has the general form of:

CBYTE=[7|0-3|0-7]

This case is similar to the third case (TFIELD=5) above, except the sense of the bits is reversed. That is, the gap and off-set byte, except for the one different bit, are all ones. This completes the description of the general forms of the data structures of the various types of atoms 30 used to compress the bit-map 20.

In addition to these general forms, some special structures of the atoms 30 are further defined, as summarized in Table 2.

TABLE 2

| | Special Forms of Atoms | | | | |
|---|---|---|---|---|---|
| Case | TFIELD | FFIELD | DFIELD | GBYTEs | MBYTEs |
| 1 | 0 | 0 | 0 | No | Yes |
| 2 | 1-3 | 0 or 1 | 0 | No | No |
| 3 | 4 | 0-3 | 0 | Yes | No |

First, in the special case of the control byte 40 having all bits set to logical zeros, the atom is in the form:

CBYTE=[0|0|0]

This atom is used as a terminator of a sequence of atoms 30 used to compress the bit-map 20. The terminator can be used as a signal for the procedures that manipulate the compressed atomic sequences.

Second, in the special case where the type field 41 is in the range of 1-3, and the DFIELD=0, e.g. no map bytes 50 are indicated. The general form of this special case has the atom as:

CBYTE=[1-3|0/1|0]

This form of the control byte 40 is used to compress a gap which is immediately followed by a byte having all bits the same but different in sense from the bits of the compressed gap. For example, in hex notation, the bit-map sequence of "FFFF00" is encoded by the single byte atom consisting of the control byte=[2|1|0]. The TFIELD=2, and the FFIELD=1 indicate two "1" filled bytes, followed by a "0" filled byte. Conversely, the bit-map sequence "000000FF" can be encoded as a control byte=[3|0|0].

Third, in the special case where the type field 41 is 4, and the DFIELD 45 is zero, the atom has the general form:

CBYTE=[4|0/1|0]

This form of the control byte 40 is similar to the case immediately above, except that the size of the compressed gap is encoded by the gap bytes 50. For example, in hex notation, the bit-map sequence of "FFFFFFFF00" is compressed into the two byte consisting of the control byte=[4|1|0] followed by a single gap byte 50 storing the hex value of "20".

Now, applying these compressed structures to the original bit-map 20 of FIG. 2, results in the following atomic byte sequence:

| atom 1 | CBYTE = [ 1 | 0 | 2 ] | ( zero filled one byte gap, |
|---|---|---|
| | MBYTE = hex 0809 | ( followed by 2 map bytes |
| atom 2 | CBYTE = [ 6 | 0 | 6 ] | ( bit 6 off-set byte, and |
| | GBYTE = hex 90 | ( 90 hex, zero filled bits. |
| atom 3 | CBYTE = [ 5 | 0 | 5 ] | ( bit 5 off-set byte-no gap |
| atom 4 | CBYTE = [ 0 | 0 | 1 ] | ( gap size = 0, followed by |
| | MBYTE = hex A0 | ( one map byte. |
| atom 5 | CBYTE = [ 4 | 0 | 1 ] | ( gap bytes and mbytes |
| | GBYTE = hex 101 | ( 100 hex, zero filled bits |
| | MBYTE = hex AC | ( followed by 1 map byte. |

Thus, by using the structures of the invention, the integer vector is compressed to five atoms for a total of twelve 8-bit bytes, a fraction of the original size.

BIT-MAP ENCODING

The following serves as an introduction to the detailed description of an exemplary method used to compress an input bit-map into an output atomic sequence utilizing the structures described above. The input bit-map is compressed by individually examining the bits in sequence from the first bit to the last bit, or with reference to FIG. 2, from right to left. During this processing, the bits are examined in context of the aligned bytes in which the bits reside.

A current bit of a current byte is the next bit to be encoded into a current atom. A previous bit has already been encoded into a previous atom having a previous control byte. The following general principles are applied during the encoding process.

If the gap between the previous and current bit includes one or more bytes having all the bits the same but different in sense from the previous and current bit, then all such intervening bytes are encoded as gaps. If the gap includes four or more bytes, the gap is encoded as gap bytes, otherwise, the gap is encoded in the control byte. Note, that since the atomic structures are fully symmetrical, this rule applies equally to both zero and one filled gaps.

If the current bit is a bit of an off-set byte, and if the previous bit was encoded as a gap, or as an off-set byte, or as the highest possible (fifteenth) map byte, then encode the current byte as an off-set byte. Else, add the current byte to the previously encoded map bytes sequence, and increment the map byte count in the DFIELD of the previously encoded control byte.

If the current bit is neither a bit of a gap byte, nor a bit of an off-set byte, then either append the current bit to the previously encoded map byte sequence, or, upon reaching the map byte limit, which is fifteen in the exemplary embodiment, produce a new atom having a map byte sequence.

These rules guarantee a compressed atomic sequence having the least number of bytes. The encoded structures produced according to these rules can generally be described by the following statements.

All bytes having all bits the same are encoded as gaps, and are never part of a map byte sequence.

Each gap is immediately followed by either an off-set byte, or a map byte sequence, or by the opposite sense gap byte as in the special case of control byte=[-1-4|0/1|0].

A full map byte sequence is always followed by either a gap, an off-set byte, or another map byte sequence.

In the detailed description of the method used to encode the atomic structure the following variables and nomenclature are defined.

The bits of the input bit-map to be compressed can be expressed as:

$b(0), \ldots, b(I), \ldots, b(K), \ldots, b(N)$ where:
  $b(0)$ is the first bit of the bit-map;
  $b(I)$ is the current bit;
  $b(K)$ is initially the first bit of the next byte; and
  $b(N)$ is the last bit of the bit-map.

The bytes of the output atomic sequence can be expressed as:

$B(0), \ldots, B(PP), \ldots, B(P), \ldots, B(T)$ where:
  $B(0)$ is the control byte of first atom;
  $B(PP)$ is the control byte of the previous atom;
  $B(P)$ is the control byte of the current atom; and
  $B(T)$ is the atomic sequence terminator.

Figure 5:
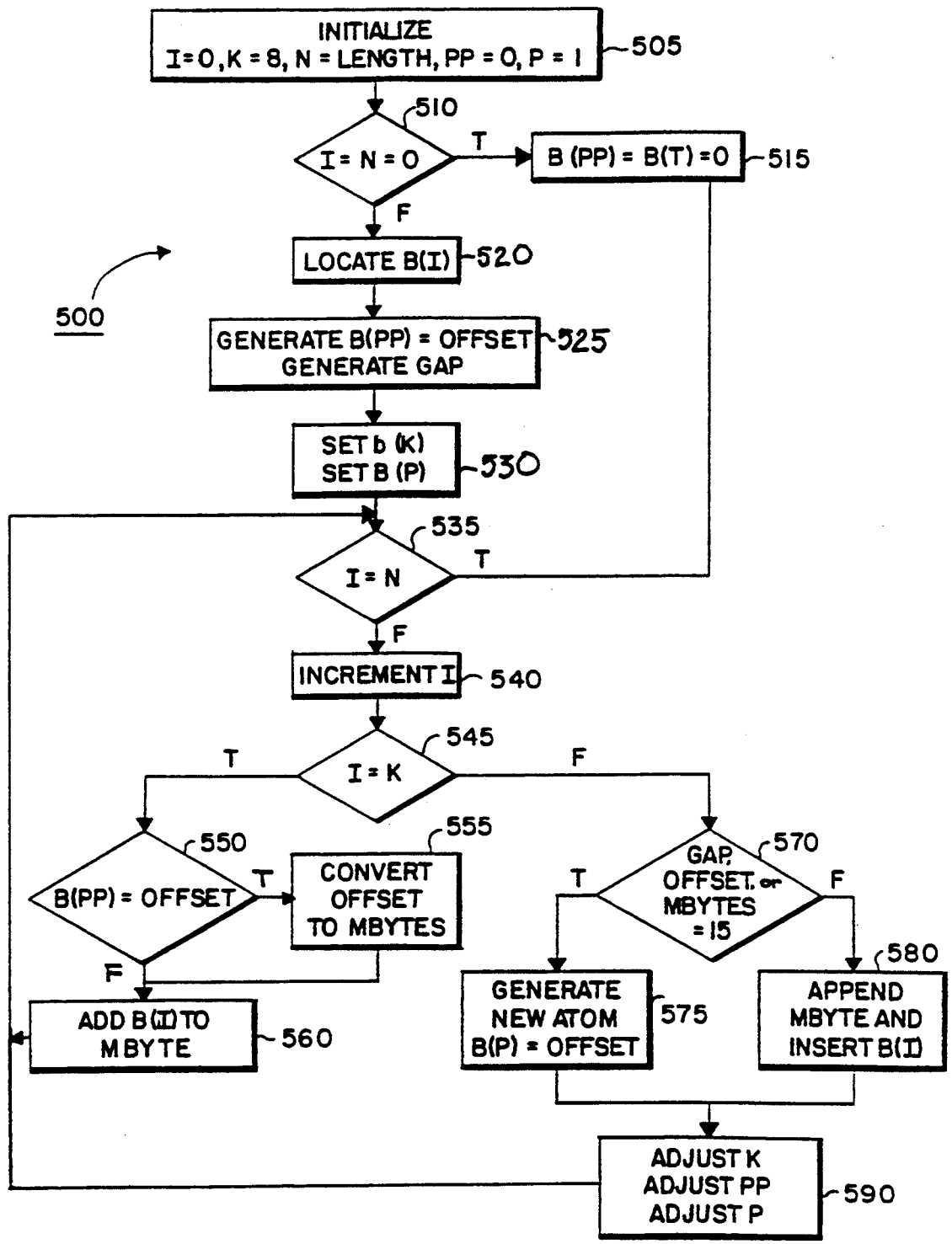
FIG. 5 is a block diagram of a procedure to encode the bit-map of FIG. 2 into an atomic sequence of FIGS. 3 and 4.

Now, with reference to FIG. 5, an exemplary method is described for encoding the bit-map according to the general rules prescribed above. The processing of the bit-map involves a first phase to initialize the scan of the bit-map, and to encode the first atom as the "previous" atom. This first phase is followed by a loop for processing the rest of the bits of the bit-map until all bits have been compressed.

In step 505, initialize the variables I, K, N, PP, and P. Then, in step 510, determine if the input bit-map is empty. If true, then in step 515, generate the terminator atom $B(T)$, for example $B(PP)=0$. Otherwise, if false, in step 520, beginning with $b(0)$, locate the first $b(I)$ different in sense from the previous bits.

In step 525, generate $B(PP)$ as an off-set byte. Also, encode the size of the first gap, if any, in the control byte $B(PP)$ of the first atom, or as gap bytes if the size of the gap is greater than twenty-four bits, or three bytes.

In step 530, set $b(K)$ to the first bit of the next aligned byte, and set $B(P)$.

Now, continuing with step 535, determine if all bits of the bit-map have been examined. If true, continue with step 515. Otherwise, if false, in step 540, prepare to examine the next bit by incrementing I.

In step 545, determine if $I<K$. That is, determine if the current bit $b(I)$ is located within the same byte as the previously encoded bit. If true, continue with step 550 to incorporate the current bit in the current atom having a control byte $B(PP)$. Otherwise, if false, continue with step 570.

In step 550, determine if the current atom encodes an off-set byte. If false, continue with step 560. Otherwise, if true, in step 555, convert the current atom to a form which encodes bits as map bytes, and continue with step 560.

In step 560, add the current bit to the map bytes of the current atom and continue with step 535.

At step 570, it has been determined that the current bit $b(I)$ is located in an aligned bit-map byte which has not yet been encoded $(I>=K)$. Therefore, a determination is made if there is a gap $(I>=K+8)$, or if the current control byte is an off-set byte, or if the map byte count has reached the fifteen byte limit.

If any of these cases are true, then in step 575, generate a new atom by encoding the current bit into $B(P)$ as an off-set byte. Also, encode the size of the first gap, if any, in the control byte $B(PP)$, or as gap bytes if the size of the gap is greater than twenty-four bits, or three bytes. Continue with step 590.

Otherwise, in step 580, append an additional map byte to the current atom, and insert the current bit therein, and continue with step 590.

In step 590, adjust K to the first bit of the next byte, and adjust PP and P as required, continue with step 535 until all bits have been examined. The variable K can be adjusted to index the first bit of the next byte by clearing the low order 3 bits of the variable I, and adding eight.

Although many other methods for compressing bit-maps into the structures defined herein are possible, the preferred method, processing one bit at the time, delivers a unique sequence of atomic structures for each different bit-map. Therefore, since the atomic sequence is unique for a particular expression of a bit-map, entire compressed bit-maps can readily be compared to determine, for example, bit-map identity, by a single byte string instruction.

Furthermore, this exemplary embodiment of the method to encode the bit-map into the structure as defined by the invention is guaranteed to be the most parsimonious in consuming storage space in the memory 3.

Also, since bits are encoded one at the time, the procedure for encoding can be efficiently implemented by, for example, a software program generally insensitive to the gross distribution of the zero and one values of the bits throughout the bit-map, the software program requiring only a limited number of time consuming decision making steps.

Alternatively, the procedure can be implemented as hardware. For example, a hardware implementation would be well suited for converting a serial input bit streams to an output compressed byte stream to transmit over a communications network. Again, the bit-by-bit processing of the preferred method is well suited for low-cost hard wired logic circuits, latches, and gates.

As the bits of the bit-map are processed, the encoding method delivers control bytes, gap bytes, map bytes, and converts off-set bytes. All of these operations, including off-set byte conversion, are fast and trivial because of the orthogonal properties of the generated code.

For example, the structure of large gaps is independently encoded within the gap bytes, without being affected by the rest of the atomic structure. Note particularly, that the length of the gap byte sequence, in bits, is encoded in the same base (eight) as the number of bits per byte. Note, the easy differentiation of atoms which encode off-set bytes (control byte less than 160), and those atoms that do not. Similarly, the dual sense (ones, or zeros) of off-set bytes, and gap bytes are totally symmetrical, and can therefore be processed by the identical code, simply by keying off the FFIELD 44, and processing the bits of the gaps and the off-set bytes in a complementary fashion. The elegance and simplicity of the structures summarized in Tables 1 and 2, are particularly well suited for processing by modern high performance processors utilizing, for example, reduced instruction set architectures.

The compression rate according to the present invention has been compared with that of the previously described prior art Delta-compression. The compression rate was measured as the number of compressed bytes divided by the number of bytes used to represent the original integer vector with each integer expressed as four bytes. The integer vectors had differences between consecutive integers randomized over variously size ranges, for example 1, 2, 3, 11, 21, 51, 201, 10001, and 100001.

Delta-compression was slightly better for sparse vectors, and the compression according to the invention was better for dense vectors. For an ascending integer vector, having one million randomly generated integers, the present invention encoded about twice as fast, and decoded about four times faster than Delta-compression.

BIT-MAP DECODING

An exemplary embodiment of a method to decompress an input atomic sequence into an output bit-map will be now described. Generally, the method scans the atomic sequence from the first atom B(O) until the terminator B(T) is encountered. The method disclosed herein, will decode atomic sequences produced by obeying the encoding rules described above for producing the shortest possible atomic sequence, as well as any other atomic sequence, not necessarily the shortest, in conformance with the data structures summarized in Tables 1 and 2.

During decoding, the method examines each atom in turn, and parses the control byte 41 to decipher gaps, map bytes, and off-set bytes.

Figure 6:
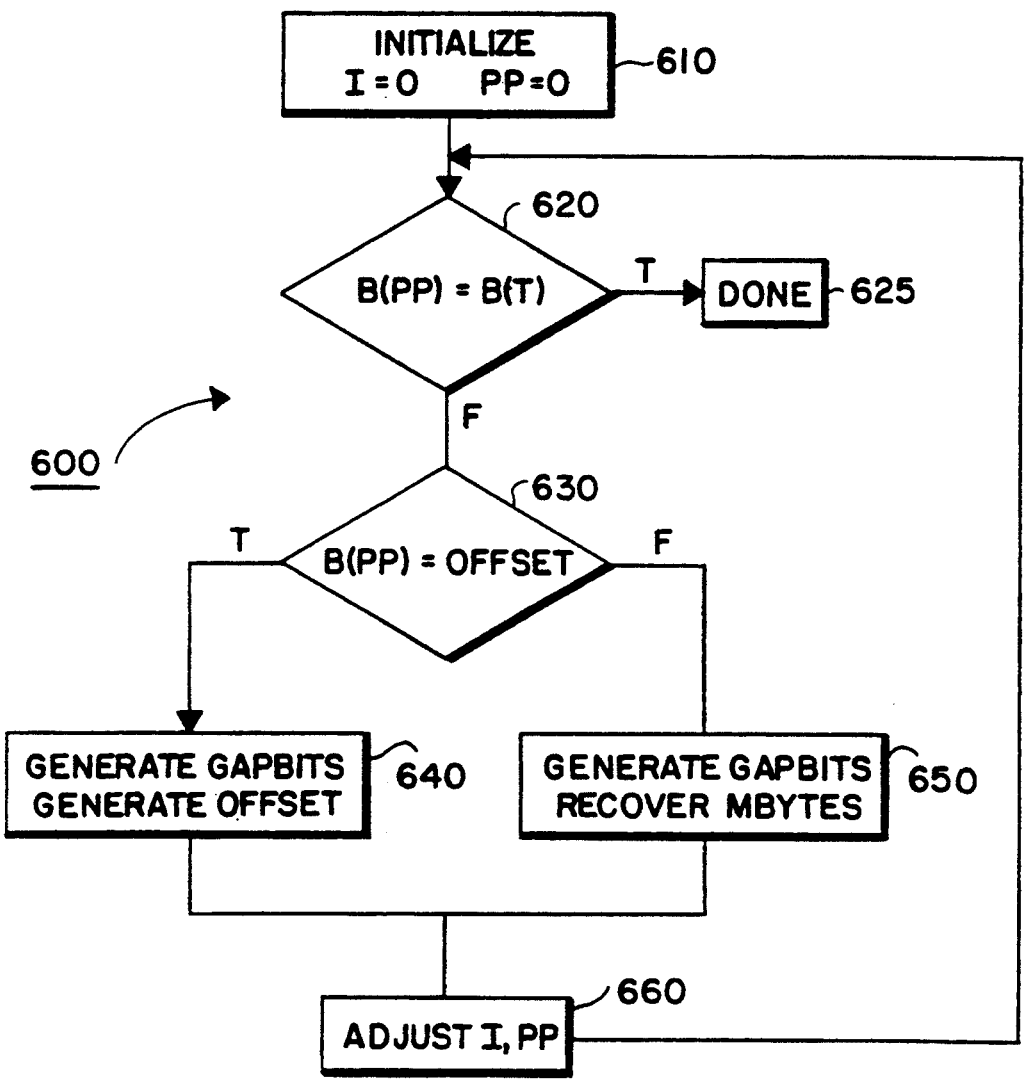
FIG. 6 is a block diagram of a procedure to decode the atomic sequence into the bit-map.

With specific references to FIG. 6, illustrating the exemplary embodiment of the method, in step 610, initialize the variables I, and PP. The variable I indicating a current bit generated for the bit-map, and pp indicating the bytes of the current atom B(PP).

In step 620, examine the control byte of the current atom B(PP), and determine if it is a terminator atom B(T), in which case the decoding of the atomic sequence has been completed, exit via step 625.

Otherwise, in step 630, determine whether the current atom encodes an off-set-byte. If true, in step 640, calculate the size of the preceding gap, if any, from the control byte, or from the gap bytes. Generate the necessary bits of the gap according to the indicated sense of the FFIELD 44, and produce the decoded off-set byte. Continue with step 660.

Otherwise if false, the current atom B(PP) encodes map bytes, and in step 650, generate the bits of the gap, if any, and recover the bits of the map bytes. Continue with step 660.

In step 660, adjust the variable I, PP, and continue with step 610 until all atoms have been decode.

It should be apparent, that the elegance of the byte aligned atomic structures makes decoding of the compressed bit-map much faster when compared with, for example, Delta-encoded bit-maps.

BIT-MAP MERGING

In addition, a method for logically merging encoded bit-maps is described. Encoded bit-maps are merged by applying a logical operator, for example AND, OR, NAND, NOR, XOR, etc., on the corresponding encoded bytes of the bit-maps to be merged. It should be apparent from this description, that these operators can provide the logical intersection, union, and difference of bit-maps.

The merging of two atomic sequences, according to the exemplary method of the invention, is performed according to the following general definitions and rules. Although these rules are explained with reference to the AND and OR operators and zero filled gaps, amplifying the rules and procedures for use with other logical operators and "one" filled gaps will become self-evident.

Define two input bit-maps to be merged as a left bit-map and a right bit-maps having left and right bits, respectively. Define the compressed structures encoding the two bit-maps as left and a right atomic sequences having left and right atoms, respectively. Define the result after merging of the left and right atomic sequences the output atomic sequence.

Partially decode atoms from the left and right atomic sequences into left and right bytes, respectively. Classify the left and the right byte as a gap byte or a non-gap byte. Determine if a particular pair of bytes are of the same class, or of a different class, and apply either Rule I, or Rule II to produce an output byte to be incorporated into the output atomic sequence.

RULE I

Bytes are different classes

If a gap byte of either the left or right bit-map corresponds to a non-gap byte of the other bit-map, then skip the non-gap byte, and duplicate the gap byte into the output byte for incorporation into the output atomic sequence for the AND operator. In case of the OR operator, skip the gap byte and duplicate the non-gap byte into the output byte.

Likewise, due to symmetry of the compressed atoms, one filled gaps are processed by applying the skipping and duplicating step in a complementary manner. That is for one filled gaps, duplicate non-gap bytes and skip gap bytes in case of the AND operator, and duplicate gap bytes and duplicate non-gap bytes in case of the OR operator.

RULE II

Bytes are same class

If the left and the right bytes are gap bytes, or both bytes are non-gap bytes, then perform the logical operation, for example AND, to produce the merged output byte for incorporation into the output atomic sequence.

Figure 7:
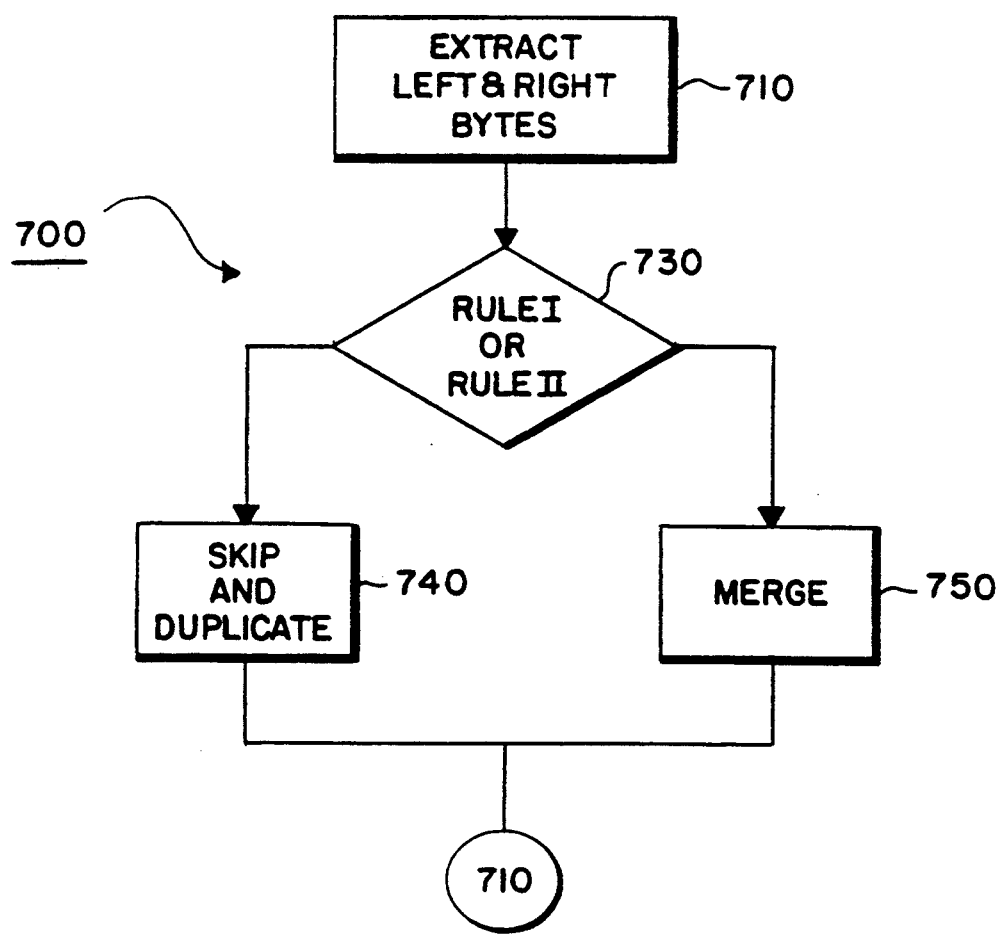
FIG. 7 is a block diagram of a procedure to logically manipulate atomic sequences.

Now, as shown in FIG. 7, the steps of an exemplary method 700 are described. In step 710, the next left byte and the corresponding next right byte are extracted from the left and right atomic sequences for merging. The left and right bytes are produced by partially decoding the respective left and right atomic sequences, from beginning to end, generally asynchronously.

It should be apparent that the atoms of the left and right sequences do not necessarily encode bit-map bytes in parallel, unless the two compressed bit-maps are bit-by-bit identical, and furthermore, unless the two bit-maps are both encoded by identical methods. Optimizing techniques for synchronized decoding are set forth bellow.

The step 710, to produce the right and left bytes, can be modeled, for example, after the decoding method as described above for FIG. 6, maintaining separately a set of variables for the left and right atomic sequence to be decoded.

In step 730, determine if either Rule I or Rule II need to be applied. Then in steps 740 and 740 apply the appropriate Rule. Continue with step 710 until done.

If the left and right atomic sequences are non-overlapping, the bytes corresponding to the "missing" bytes can be skipped, duplicated, and merged as indicated for the logical operator.

In support of Rule I, and Rule II, and as summarized in Table 3 below, two skip flags, and three byte masks are suggested to improve the speed of merging of bit-maps. By using flags and masks, the core of Rules I and II can be implemented, for example, by a single efficient in-line generic instruction sequence, without requiring time consuming decision type of instructions.

In Table 3, the symbols "&, |, /, and \" are used to indicate the following logical operations on the left (A) and right (B) bit maps A.

&—intersection, i.e., A AND B
|—union, i.e., A OR B
/—difference, i.e., A AND (NOT B)
\—difference, i.e., (NOT A) AND B

TABLE 3

| | Skip Flags and Merge Operators | | | | |
|---|---|---|---|---|---|
| Operator | skip1 | skip2 | op1 | op2 | op3 |
| & | 1 | 1 | 00 | 00 | 00 |
| \| | 0 | 0 | FF | FF | FF |
| / | 1 | 0 | FF | 00 | 00 |
| \ | 0 | 1 | 00 | FF | 00 |

The skip flags indicate whether or not the left and right bytes are to be skipped or duplicated for a particular logical operator. The byte masks are used to produce the output byte (obyte) from the left byte (lbyte) and right byte (rbyte) for any of the listed logical operators by using the following calculation.

obyte=((lbyte XOR op1) AND (rbyte XOR op2) XOR op3)

As an advantage, this exemplary embodiment of compressed bit-map merging achieves a high speed because bits of the bit-map are processed byte wise. And, in addition, for those portions of the bit-map where the left and right atoms are identical, large numbers of bits, can be processed by directly manipulating the atoms without complete decoding. For example, merging compressed bit-maps as described herein is typically about ten to thirty times faster than merging with traditional bit-wise or Delta-compressed data.

The compressed structures of the invention, and the methods used to logically manipulate the atoms are particularly useful in conjunction with large data base, where an ordered sequence of record identifications or indices are stored in a multi-way binary-tree (B*-tree). If duplicate records are possible, each record should only have one copy of the index, the other duplicate indices could be expressed as a list in a bit-map compressed, for example, according to the methods and structures disclosed herein. In order to support the use of the atoms disclosed herein for B-trees the logical operations of single bit insertion and a single bit deletion are supported.

Supposed a bit representing an index is to be inserted into a bit-map representing an ordered set of duplicate indices. Then, if A represents the compressed atomic sequence of the set, and if the single bit is compressed into an atomic sequence B, then the operation (A OR B) will insert the single bit into A. Similarly, the operation (A and (not B)) would delete the bit from the bit-map. The merge method can be optimized for insertion and deletion by simply duplicating those portions of the atomic sequence representing the bit-map, other than the atom or atoms which are altered due to the insertion or deletion of a particular bit.

Also, computerized images, where the individual pixels of the images are represented by bit-maps, can be enhanced by the methods of the invention. For, example, an enhanced image can be produced by subtracting one ore more images from another image by using the appropriate logical merge operation according to the invention.

While the invention has been described in conjunction with exemplary embodiments thereof, it is evident that there are many other alternatives, modifications, and variations. Accordingly, it is intended to cover these equivalent arrangements within the spirit and scope of the appended claims.

I claim:

1. In a computer system, a method for compressing data comprising the steps of:

storing the data into a first set of bytes of a memory of the computer system, each byte of said set of bytes including an identical number of bits for storing logical values;

classifying a byte of said first set of bytes as a gap byte if each bit of said byte stores the identical logical value, otherwise, classifying said byte as a map byte;

grouping adjacent identically classified bytes;

storing, in a second set of ordered bytes of said memory, for each group of gap bytes, a first bit sequence representative of the number of bits in said group of gap bytes;

storing, in said second ordered set of bytes, for each group of map bytes, a second bit sequence representative of the number of bits in said group of map bytes, said second set of bytes having an order corresponding to said first set of bytes.

2. The method as in claim 1 further including the steps of sensing if said bits of a particular group of gap bytes stores all zeros or all ones, storing a flag associated with a particular first bit sequence corresponding to said particular group of gap bytes, said flag indicative of the sense of said bits of said particular group of gap bytes.

3. The method as in claim 2 further including the steps of
sensing if a first byte of a group of map bytes has exactly one bit different than an immediately preceding group of gap bytes, and
in response to said sensing, storing said first byte as a bit off-set in said second set of bytes, said bit off-set associated with a corresponding first bit sequence representative of said preceding group of gap bytes, said bit off-set indicative of the position of said one different bit in said first byte.

4. The method as in claim 3 further including the steps of
organizing said set second set of bytes as a plurality of atoms, each of said atoms including a control byte for storing said first bit sequence, said second bit sequence, and said flag.

5. The method as in claim 4 further including the step of
storing said first bit sequence in a byte following said control byte if the number of bits in said group of gap bytes is larger than a predetermined number.

6. An apparatus for compressing data including:
a memory having a first set of bytes for storing the data, each byte including a plurality of bits for storing logical values representative of the data, said logical values being either a one or a zero;
means for classifying a byte of said first set of bytes as a gap byte if all of said plurality of bits of said byte store the identical logical value, otherwise classifying said byte as a map byte;
means for counting the number of bits in adjacent bytes having the identical classification;
means for storing a first bit sequence representative of the counted number of bits in a second set of bytes of said memory for each group of adjacent gap bytes;
means for storing a second bit sequence representative of the counted number of bits in said second set of bytes for each group of adjacent map bytes;
means for storing said group of adjacent map bytes in said second set of bytes, the order of said first and second set of bytes corresponding to each other.

7. The apparatus as in claim 6 further including
means for sensing if a particular group of gap bytes stores all zeros or all ones, and
means for storing a flag associated with a particular first bit sequence, said flag indicative of the sense of the bits of said particular group of gap bytes.

8. The apparatus as in claim 7 further including
means for sensing if a first byte of a group of map bytes has exactly one bit different than an immediately preceding group of gap bytes, and
means, response to said sensing means, for storing said first byte as a bit off-set in said second set of bytes, said bit off-set associated with a corresponding first bit sequence representative of said preceding group of gap bytes, said bit off-set indicative of the position of said one different byte in said first byte.

9. A method for compressing data comprising the steps of:
storing the data into a source set of bytes of a storage device, each source byte having a plurality of bits, each of said bits to store a logical zero or a logical one;
determining if all of said plurality of bits of a particular byte of said source set of bytes store the identical logical value;
in response to a true determination, classifying said particular byte as a gap byte, otherwise classifying said particular byte as a map byte;
grouping adjacent identically classified bytes of said source set of bytes;
counting the number of said bits in each group of adjacent identically classified bytes;
storing in a destination set of bytes of said storage device, for each group of classified gap bytes, a gap bit sequence representative of the number of said counted bits of said groups of gap bytes;
storing in said destination set of bytes of said storage device, for each group of classified map bytes, a map bit sequence representative of the number of said counted bits of said groups of map bytes; storing in said destination set of bytes of said storage device, each group of classified map bytes, the order of said source and destination sets of bytes corresponding to each other.

* * * * *